United States Patent [19]

Tobita

[11] Patent Number: 4,833,656

[45] Date of Patent: May 23, 1989

[54] FAST ACCESS CIRCUIT FOR DYNAMIC TYPE SEMICONDUCTOR MEMORY DEVICE

[75] Inventor: Youichi Tobita, Hyogo, Japan

[73] Assignee: Mitsubishi Denki Kabushiki Kaisha, Tokyo, Japan

[21] Appl. No.: 119,897

[22] Filed: Nov. 12, 1987

[30] Foreign Application Priority Data

Nov. 11, 1986 [JP] Japan .................. 61-268296

[51] Int. Cl.⁴ .................. G11C 8/00; G11C 7/02; H03K 3/38
[52] U.S. Cl. .................. 365/230.06; 365/210; 365/226; 307/279
[58] Field of Search .......... 365/189, 182, 230, 226; 307/279, 441

[56] References Cited

U.S. PATENT DOCUMENTS

| 3,969,706 | 7/1976 | Proebsting et al. | 365/230 |
| 4,651,029 | 3/1987 | Oritani | 365/230 |
| 4,675,850 | 6/1987 | Kumanoya et al. | 365/230 |

FOREIGN PATENT DOCUMENTS 250247 12/1983 Japan .

Primary Examiner—Terrell W. Fears
Assistant Examiner—Melissa J. Koval
Attorney, Agent, or Firm—Lowe, Price, LeBlanc, Becker & Shur

[57] ABSTRACT

A semiconductor memory device comprises a row address buffer (5') which operates in response to an external address signal ($A_0 \sim A_7$) for generating an internal address signal ($A_n$, $\overline{A}_n$) from the supplied external address signal. Row decoding is performed in response to an external clock signal RAS.

7 Claims, 8 Drawing Sheets

FAST ACCESS CIRCUIT FOR DYNAMIC TYPE SEMICONDUCTOR MEMORY DEVICE

BACKGROUND OF THE INVENTION

1. Field of the Invention

The present invention relates to a semiconductor memory device, and more particularly, it relates to an improvement in a row address signal generation circuit for a dynamic type semiconductor memory device.

2. Description of the Prior Art

FIG. 1 schematically shows the structure of a conventional dynamic type semiconductor memory device (DRAM) having 64 Kbit (65536 bit) memory cells.

Referring to FIG. 1, the conventional DRAM includes a memory cell array 1 for storing information.

The memory cell array 1 is formed by 65536 memory cells arrayed in the form of a matrix of rows and columns, a plurality of word lines for selecting a row of the memory cells and a plurality of bit lines for selecting a column of the memory cells. Each memory cell MC is formed by a capacitor C for storing information in the form of charges and a transfer gate Q for connecting the capacitor C to a bit line BL in response to a potential supplied to a word line WL. The transfer gate Q is formed by an insulated gate field effect transistor.

The conventional DRAM further has a clock generation part, an address decoder part and data input/output part as peripheral circuits of the memory cell array 1.

The clock generation part comprises an RAS clock generation circuit 17 for supplying a plurality of control signals of FET level (5 V) for controlling operations of various circuits relating to row addresses in response to an external clock signal $\overline{RAS}$ supplied to an input terminal 16 and CAS clock generation circuit 19 for generating a plurality of control signals of the FET level for controlling operations of various circuits relating to column addresses in response to a signal $\overline{CAS}$ supplied to an input terminal 18 and a control signal from the RAS clock generation circuit 17. The CAS clock generation circuit 19 is activated only when the signal $\overline{RAS}$ is in an activated state.

The address decoder part includes a row address part and a column address part. The row address part includes a row address buffer 5 which is activated in response to a control signal from the RAS clock generation circuit 17 to convert external address signals of TTL level (about 2.4 V) supplied to an address input terminal 6 into complementary 8-bit internal row address signals of the FET level, a row decoder 4 which is activated in response to a control signal from the RAS clock generation circuit 17 to decode the 8-bit internal address signals from the row address decoder 5 and select one from 256 ($2^8$) combinations thereby to select a corresponding word line and a word driver circuit 3 which is activated in response to a control signal from the RAS clock generation circuit 17 to activate the selected word line in response to output from the row decoder 4. The word driver circuit 3 includes word line drivers provided in correspondence to respective word lines. The row decoder circuit 4 has unit row decoders provided in correspondence to the word lines, and outputs from the unit row decoders are supplied to corresponding word line drivers. Thus, a unit row decoder is selected by the internal row address signal from the row address buffer, so that a word line is selected and activated through a word line driver in the word driver circuit 3. Further, the address input terminal 6 is supplied with time-multiplexed external address signals, namely, the address input terminal 6 is first supplied with an external row address signal for selecting a row of the memory matrix and then with an external column address signal for selecting a column of the memory matrix. Such a DRAM for receiving time-multiplexed address signals is described in U.S. Pat. No. 3,969,706 entitled "Dynamic Random Access Memory MISFET Integrated Circuit".

The column address part comprises a column address buffer 9 which is activated in response to a control signal from the CAS clock generation circuit 19 to convert 8-bit external column address signals of the TTL level supplied through the address input terminal 6 into complementary 8-bit internal column address signals of the FET level and a column decoder circuit 8 which decodes the 8-bit internal column address signals from the column address buffer 9 and selects one from 256 ($2^8$) combinations to select a corresponding bit line.

The data input/output part comprises a sense amplifier 2 which is activated in response to a control signal from the RAS clock generation circuit 17 to detect and amplify memory cell data read on each bit line, an I/O gate 7 which is activated in response to a control signal from the CAS clock generation circuit 19 to connect the bit line selected by the output of the column decoder 8 to a data input buffer 11 and a data output buffer 13, the data input buffer 11 which in response to a control signal from a R/W buffer receives input data $D_{IN}$ to be written through an input terminal 10 to convert the same into an internal data input signal of the FET level, the data output buffer 13 which in response to a control signal from the R/W buffer and a control signal from the CAS clock generation circuit 19 converts read data of the FET level supplied through the I/O gate 7 into an output signal of the TTL level to supply the same to an output terminal 12 and the R/W buffer 15 which in response to a control signal from the CAS clock generating circuit 19 converts an R/W signal of the TTL level for designating read/write operation mode supplied through an input terminal 14 into an internal R/W signal of the FET level. Output from the R/W buffer 15 is supplied to the data input buffer 11 and the data output buffer 13, to activate the data output buffer 13 in data reading and activate the data input buffer 11 in data writing.

Although FIG. 1 illustrates only one address input terminal 6, a plurality of such address input terminals 6 are provided to receive 8-bit address signals in a parallel manner.

Further, although the RAS clock generation circuit 17 illustrated in FIG. 1 generates only a single type of control signal, the respective circuits of the row address system are supplied with control signals which are different in timing from each other. Similarly the respective circuits of the column address system are supplied with control signals being different in timing from the CAS clock generation circuit 19.

It is generally believed that access time is the most important index of the performance of a semiconductor device. "Access time" is the time required for reading data from a memory cell after supply of an eternal address signal.

FIG. 2 is a waveform diagram showing data read operation of the DRAM as shown in FIG. 1. With reference to FIGS. 1 and 2, description is now made on the data read operation of the conventional DRAM.

As shown in FIG. 2, the operation is initiated by setting a row address signal for designating a row address corresponding to the address of a memory cell to be selected. Namely, external address signals $A_0$ to $A_7$ are supplied to the row address buffer 5 through the address input terminal 6. Then the signal $\overline{RAS}$ falls to a low level and the row address buffer 5 is responsively activated to generate an internal row address signal to supply the same to the row decoder 4. Then an external column address signal is supplied to the external address input terminal 6. Thereafter an external $\overline{CAS}$ signal falls to a low level, so that the external column address signal is strobed in the column address buffer 9. The column address buffer 9 is activated by a control signal from the CAS clock generation circuit 19 in response to the fall of the signal $\overline{CAS}$ to generate an internal column address signal and supply the same to the column decoder 8. Under control by the series of control signals from the RAS clock generation circuit 17 an the CAS clock generation circuit 19, the row decoder circuit 4, the word driver circuit 3, the sense amplifier 2, the column decoder 8 and the I/O gate 7 are activated so that information of the memory cell addressed by the external address signal is transmitted to the I/O gate 7. On the other hand, the R/W signal for designating the operation mode is set at, for example, a high level for designating read operation. This R/W signal is strobed in the R/W buffer 15 in response to the fall of he clock signal $\overline{CAS}$, to be supplied to the data output buffer 13 and to the data input buffer 11. Thus, only the data output buffer 13 is activated in response to the $\overline{CAS}$ signal and the R/W signal so that read data from the I/O gate 7 is transmitted to the output terminal 12. Thus, the information is read from the selected memory cell.

Writing data into the memory cell is performed by setting the R/W signal at a low level. When the R/W signal is set at the low level, the data output buffer 13 enters a high impedance state while the data input buffer 11 is activated and data supplied to the data input terminal 10 is written into a memory cell selected through the I/O gate 7 at timing similar to that in reading.

Internal operation of the conventional DRAM as shown in FIG. 1 starts when the signal $\overline{RAS}$ enters an activated state, i.e., when the same falls to a low level, and hence the access time is defined by time $t_{RAC}$ (time from fall of the signal $\overline{RAS}$ to the low level to generation of the output data from the terminal 12) in FIG. 2.

FIG. 3 is a block diagram showing a circuit for generating a word line driving signal in the conventional DRAM. The word line driving signal is transmitted to a word line selected through the word driver circuit 3 as shown in FIG. 1. Referring to FIG. 3, a row decoder 4' for decoding internal row address signals of a predetermined combination applied from the row address buffer 5 and a dummy decoder 4a for defining a timing in generating a word line driving signal in response to a pair of row address signals $RA_n$, $\overline{RA_n}$, and a word driver 3' for generating a word line driving signal to transfer the same onto a selected word line in response to the output of the row decoder 4' and the dummy decoder 4a are provided for one word line. Therefore, the row decoder circuit 4 as shown in FIG. 1 includes such row decoders 4' corresponding in number to the word lines and a dummy decoder 4'. The word driver 3' is provided for each word line.

Referring to FIG. 3, a conventional word line driving signal generation system comprises an RAS buffer 17a which generates a signal RAE for activating the row address buffer 5 in response to the external clock signal $\overline{RAS}$ supplied to the clock input terminal 16, a row address buffer 5 which is activated in response to the signal RAE to decode the 8-bit row address signals $A_0$ to $A_7$ supplied to the address input terminal 6 thereby to generate eight pairs of complementary internal row address signals $RA_n$ and $\overline{RA_n}$ (n=0 to 7), row decoders 4' each of which is activated in response to a control signal from the RAS clock generation circuit 17 shown in FIG. 1 to decode 8-bit internal row address signals of a prescribed combination for outputting a high level signal RD in selection and outputting a low level signal $\overline{RD}$ in non-selection, the dummy decoder 4a for generating a signal RDD for providing rise timing of the potential of the selected word line in response to a predetermined pair of complementary internal address signals $RA_n$ and $\overline{RA_n}$ from the row address buffer 5 and the word driver 3' for transmitting a word line driving signal WL to the selected word line in response to output from the row decoder 4' and that from the dummy decoder 4a.

The output line of the row decoder 4' is generally precharged at a high level, while output of the row decoder 4' connected to a selected word line remains at a high level and outputs of the row decoders 4' connected to non-selected word lines are discharged to low levels.

The dummy decoder 4a detects that either of the internal row address signals $RA_n$ or $\overline{RA_n}$ is high, to output a clock signal RDD which goes high.

The word driver 3' is formed by an AND gate which receives the output of the row decoder 4' and that of the dummy decoder 4a. The rise timing of the signal RDD is set to be substantially simultaneous with the time when non-selected row decoder output $\overline{RD}$ falls to a low level. The reason for such timing is as follows. If the signal RDD rises before the low level of the signal $\overline{RD}$ is established, the word driver circuit 3' (two-input AND circuit) receiving the signals $\overline{RD}$ and RDD is not completely at a low level and a non-selected word line is selected in the so-called multiple choice manner, to cause malfunction of the memory device.

FIG. 4 is a waveform diagram showing the operation of the word line driving signal generation part as shown in FIG. 3. Referring to FIGS. 3 and 4, description is now made on the operation for generating the word line driving signal.

At a time $t_0$, the row address signals $A_0$ to $A_7$ are applied to the address input terminal 6 to set the row address of the memory cell to be selected. Since the clock signal $\overline{RAS}$ is high at this time, the signal RAE remains low. Thus, the row address buffer 5 is not activated but merely receives the external row address signals $A_0$ to $A_7$, and all of its outputs are at low levels.

At a time $t_1$ the clock signal $\overline{RAS}$ falls, so that the clock signal RAE from the RAS buffer 17a responsively rises to activate the row address buffer 5. The row address buffer 5 thus activated decodes the supplied external address signals $A_0$ to $A_n$ to generate eight pairs of complementary internal row address signals $RA_n$ and $\overline{RA_n}$ at a time $t_3$ for supplying the 8-bit complementary row address signals $RA_n$ and $\overline{RA_n}$ (n=0~7) of prescribed combinations to the row decoder 4' while supplying a predetermined pair of complementary row address signals $RA_n$ and $\overline{RA_n}$ (n: one out of 0 to 7) to the dummy decoder 4a.

All of the outputs of the row address buffer 5 are at low levels before the time $t_3$, and one of the pair of complementary internal address signals $RA_n$ and $\overline{RA_n}$ goes high in response to the external address signals $A_0$ to $A_7$.

At a time $t_4$, a selection/non-selection state of each row decoders 4' is established. Namely, the row decoder 4' decodes the 8-bit internal row address signals of prescribed combinations supplied from the row address buffer 5 to supply the high level signal RD when a corresponding word line is selected while outputting the low level signal $\overline{RD}$ if the corresponding word line is not selected. Since the output of the row decoder 4' is precharged at a high level before the time $t_3$, the output signal line of the row decoder 4' connected to the non-selected word line is discharged to the low level.

On the other hand, the pair of complementary internal row address signals $RA_n$ and $\overline{RA_n}$ from the row address buffer 5 are supplied to the dummy decoder 4a. The dummy decoder 4a detects rise of either the address signal $RA_n$ or $\overline{RA_n}$ to a high level, to generate the clock signal RDD which goes high at a time $t_4$.

At a time $t_5$, the word line driving signal WL rises from the word driver 3' in response to the signals RD and RDD. Thus, the potential of the selected word line (word line designated by the row address) goes high. On the other hand, the output of the word driver 3' receiving the signals $\overline{RD}$ and RDD goes low since the signal $\overline{RD}$ is at a low level. Thus, the potential of the non-selected word line remains low.

Although the interval between the rising edges of the signal RDD and the word line driving signal WL, i.e., the interval between the times $t_4$ and $t_5$ is exaggerated in the waveform diagram of FIG. 4, the said signals rise substantially at the same time.

As hereinabove described, the conventional row address buffer does not operate from the falling edge of the clock signal $\overline{RAS}$ to the rising edge of the internal clock signal RAE.

FIG. 5 shows exemplary configuration of a conventional row address buffer.

Referring to FIG. 5, the conventional row address buffer comprises a circuit part 200 for receiving a clock signal RAE and generating an internal signal $\overline{RAE}$ and a circuit part 201 for converting an external address signal $A_n$ into an internal address signal $\overline{A_n}$ response to the internal signal $\overline{RAE}$ from the circuit part 200.

The circuit part 200 is formed by an inverter which comprises a P-channel MOS transistor 129 and an N-channel MOS transistor, 130 complementarily connected with each other. The signal RAE supplied to an input terminal 131 is supplied to the gates of the MOS transistors 129 and 130. The signal $\overline{RAE}$ is outputted from a common node of a first conduction terminal of the PMOS transistor 129 and a second conduction terminal of the NMOS transistor 130. A second conduction terminal of the PMOS transistor 129 is connected to a supply poteial $V_{CC}$. A first conduction terminal of the NMOS transistor 130 is connected to a ground potential.

The circuit part 201 comprises a P-channel MOS transistor 127 and an N-channel MOS transistor 128 which are complementarily turned on/off in response to the internal signal $\overline{RAE}$ and a P-channel MOS transistor 103 and an N-channel MOS transistor 104 which are complementarily turned on/off in response to an external address signal (one bit) supplied to an input terminal 102. The PMOS transistor 127 has a first conduction terminal connected to the supply potential $V_{CC}$, a gate for receiving the signal $\overline{RAE}$ and a second conduction terminal connected to a first conduction terminal of the PMOS transistor 103. The PMOS transistor 103 has the first conduction terminal connected with the second conduction terminal of the PMOS transistor 127, a gate for receiving the internal signal $\overline{RAE}$ and a second conduction terminal connected to an output terminal 105. The NMOS transistor 128 is provided between the output terminal 105 and a ground potential, and receives the internal signal $\overline{RAE}$ in its gate. The NMOS transistor 104 is provided between the output terminal 105 and the ground potential in parallel with the NMOS transistor 128, and receives the external address signal in its gate through the input terminal 102.

Description is now made on the operation of the conventional row address buffer.

The signal RAE is inverted by the circuit part 200 to provide the signal $\overline{RAE}$. Therefore, in a standby state in which the signal $\overline{RAS}$ is at a high level, the signal $\overline{RAE}$ is also high and the PMOS transistor 127 is in an OFF state while the NMOS transistor 128 is in an ON state. In such a state, the potential of the output terminal 105 is low with no regard to the address signal potential at the input terminal 102. When the signal RAE goes high and the signal $\overline{RAE}$ goes low in response to the fall of the $\overline{RAS}$ signal, the PMOS transistor 127 enters an ON state and the NMOS transistor 128 enters an OFF state so that the circuit part 201 functions as an inverter to output an inverted signal of the address signal supplied to the input terminal 102 from the output terminal 140. The PMOS transistor 127 is so provided that undesirable current can not flow between the supply potential $V_{CC}$ and the ground potential even if the potential of the address signal supplied to the input terminal 102 in the standby state (signal $\overline{RAS}$ is high) is 2.4 V of the TTL level.

The conventional semiconductor memory device is in the aforementioned structure, and the timing for strobing the row address signal has been provided by the external clock signal $\overline{RAS}$. Since the access operation is started from setting of the row address as hereinabove described, the actual access time is $t_{AAC}$ in FIG. 2, i.e., the interval between the setting of the row address and outputting of the output data, which is longer by a time $t_{ASR}$ than the memory device access time $t_{RAC}$, i.e., the interval between the trailing edge of the signal $\overline{RAS}$ and output of the output data. The time $t_{ASR}$ is a set-up time in which the row address signal must be established before the signal $\overline{RAS}$ goes low. This value is generally defined at 0 ns, whereas it is difficult to simultaneously supply all address signals in practice, and hence the set-up time is set with a margin of 10 ns to 20 ns. As the result, the access time $t_{AAC}$ is lengthened by the marginal time $t_{ASR}$ in actual operation.

A dynamic RAM for providing address signals in a time-divisional manner is described in U.S. Pat. No. 3,969,706 entitled "Dynamic Random Access Memory MISFET Integrated Circuit" by R. J. Proebsting et al. However, this prior art example shows no structure of zeronizing the address set-up time $t_{ASR}$.

A semiconductor input circuit having small power consumption for an input signal of the TTL level is described in Japanese Patent Application No. 250247/1983 by the same inventor filed on Dec. 29, 1983 in the name of the same assignee of the present application. The semiconductor input of the reference circuit is intended to be applied to a buffer for converting a $\overline{CS}$ (chip select) signal of the TTL level into a $\overline{CS}$ signal of the FET level, but not to an address buffer.

SUMMARY OF THE INVENTION

An object of the present invention is to overcome the aforementioned disadvantages of the conventional semiconductor memory device and provide a semiconductor memory device which can reduce the access time in actual operation by initiating the operation of the memory device from setting of an external row address, thereby to implement high-speed operation.

The semiconductor memory device according to the present invention comprises a row address buffer which operates in response to transition of an external row address signal, but not to an RAS clock signal.

In the aforementioned structure, the row address buffer operates not in response to an RAS clock signal but in response to transition of an external row address signal, whereby an address set-up time $t_{ASR}$ required for the conventional memory device can be removed thereby to reduce the access time in actual operation.

These and other objects, features, aspects an advantages of the present invention will become more apparent from the following detailed description of the present invention when taken in conjunction with the accompanying drawings.

DESCRIPTION OF THE PREFERRED EMBODIMENTS

Figure 6:
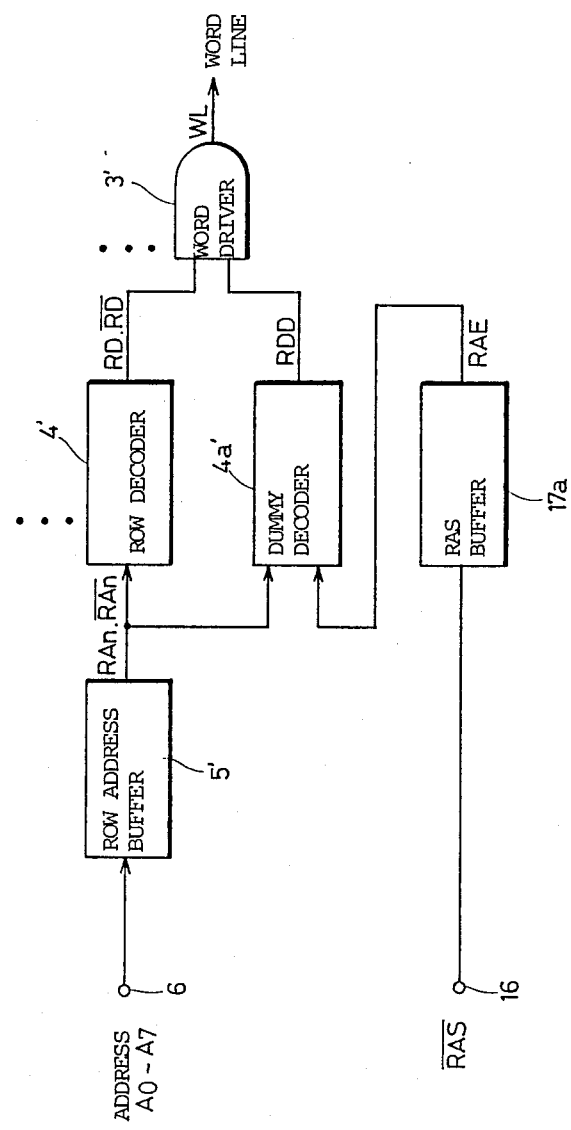
FIG. 6 is a block diagram showing the structure of a word line driving signal generation part of a semiconductor memory device according to an embodiment of the present invention.

FIG. 6 is a block diagram showing the structure of a word line driving signal generation part in a semiconductor memory device according to an embodiment of the present invention. Referring to FIG. 6, the word line driving signal generation part is formed by a row address buffer 5' which receives external row address signals $A_0$ to $A_7$ of the TTL level supplied to an address input terminal 6 to generate eight pairs of complementary internal address signals $RA_n$ and $\overline{RA_n}$ (n=0 to 7), row decoders 4' each of which decodes 8-bit internal row address signals $RA_n$ and $\overline{RA_n}$ (n: 0 to 7) of prescribed combinations from the row address buffer 5' for generating a high level signal RD in selection and a low level signal $\overline{RD}$ in non-selection, a dummy decoder 4a' which is activated in response to a signal RAE from an RAS buffer 17a to generate a timing signal RDD in response to a predetermined pair of the internal address signals $RA_n$ and $\overline{RA_n}$ from the row address buffer 5' and word drivers 3' provided for each word lines for transmitting a word line driving signal WL to a selected word line in response to outputs from the row decoder circuit 4' and the dummy decoder 4a'. The structure shown in FIG. 6 relates to only a single word line.

In the semiconductor memory device of the present invention as shown in FIG. 6, the row address buffer 5' is not controlled by the signal RAE, but is directly driven by external address signals. The signal RAE is supplied to the dummy decoder 4a', to provide timing for generating the word line driving signal WL.

Figure 7:
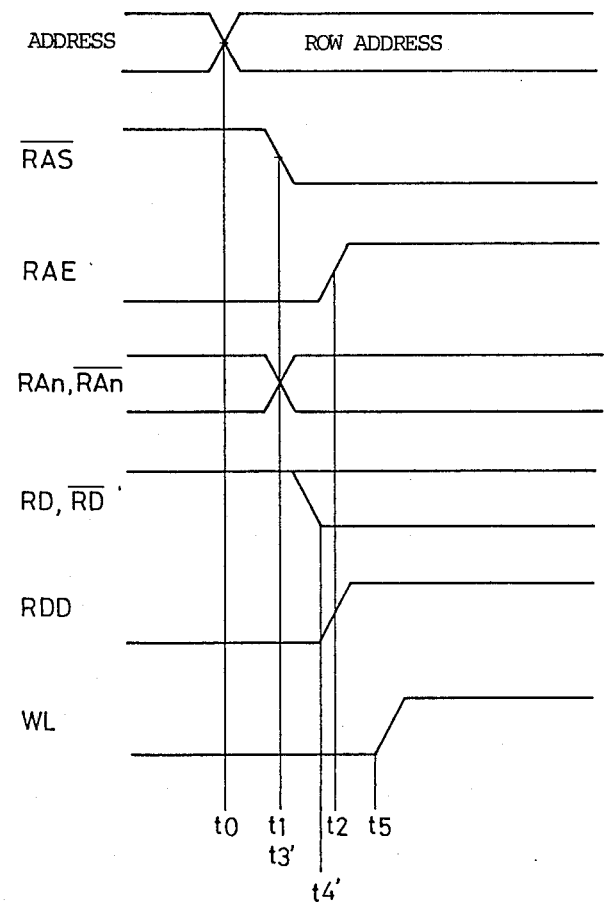
FIG. 7 is a waveform diagram for showing the operation of the word line driving signal generation part as shown in FIG. 6.

FIG. 7 is a waveform diagram showing the operation of the semiconductor memory device as shown in FIG. 6.

With reference to FIGS. 6 and 7, description is now made on the operation of the semiconductor memory device according to the embodiment of the present invention.

Before a time $t_0$, no external address signal is set and hence output of the row address buffer 5 is in an invalid (undefined) state.

When external address signals are set at the time $t_0$, the row address buffer 5' immediately operates so that eight pairs of internal address signals $RA_n$ and $\overline{RA_n}$ are established at a time $t_3'$ ($=t_1$). Among the eight pairs of complementary internal address signals, 8-bit row address signal of prescribed combination are supplied to the row decoder 4'. The row decoder 4' decodes the supplied internal address signals to maintain the precharge potential of its output line in a selection state while discharging the output line to a ground potential in a non-selection state. Thus, the output state of the row decoder 4' is established at a time $t_4'$, whereby selected row decoder output remains high and non-selected row decoder output goes low. Here, the selected row decoder represents a row decoder connected to a selected word line, and the non-selected row decoder denotes a row decoder connected to a non-selected word line.

On the other hand, the external clock signal $\overline{RAS}$ falls at the time $t_1$ ($=t_3'$) after setting of the external address signals. In response to the fall of the signal $\overline{RAS}$, the signal RAE from the RAS buffer 17a rises at a time $t_2$ to be supplied to the dummy decoder 4a'. The dummy decoder 4a' is supplied with a predetermined pair of internal address signals $RA_n$ and $\overline{RA_n}$ from the row address buffer 5' to detect a high level of either of the signal $RA_n$ or $\overline{RA_n}$. The dummy decoder 4a' is activated on the rising edge of the signal RAE at the time $t_2$, whereby the signal RDD outputted from the dummy decoder 4a' goes high. As the result, output of the word driver 3' receiving the selected row decoder output RD rises at a time $t_5$ ($\approx t_2$), so that the word line driving signal WL is transmitted to the word line selected by the external row address signal. Thus, one word line is selected. Since the non-selected row decoder output $\overline{RD}$ is low, the output of the word driver 3' for receiving the signal $\overline{RD}$ remains low and no word line connected to the non-selected row decoder is selected.

Figure 1:
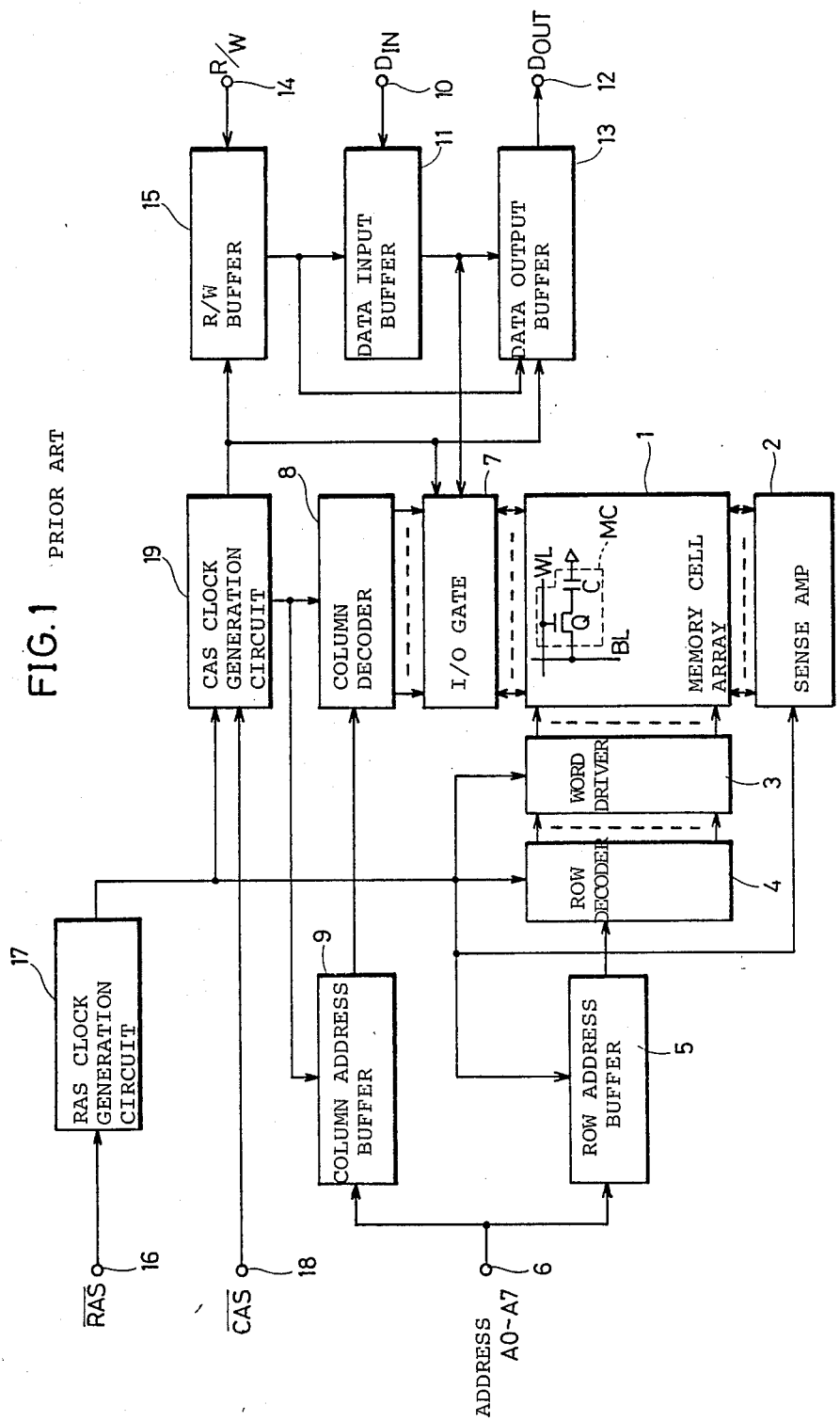
FIG. 1 illustrates exemplary structure of a conventional semiconductor memory device.
Figure 2:
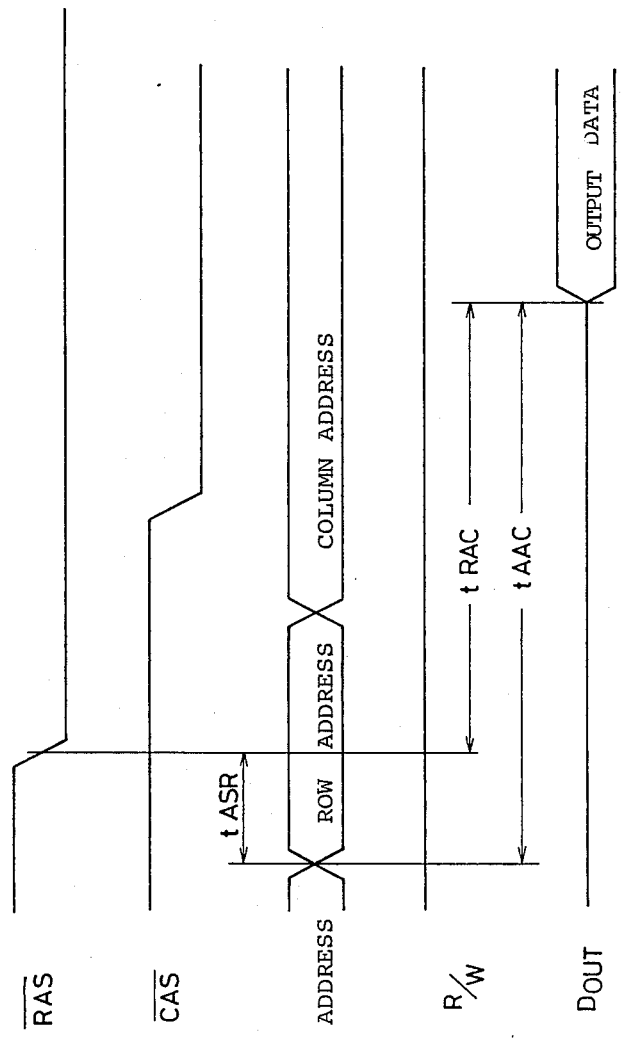
FIG. 2 is a waveform diagram showing read operation of the conventional semiconductor memory device.
Figure 3:
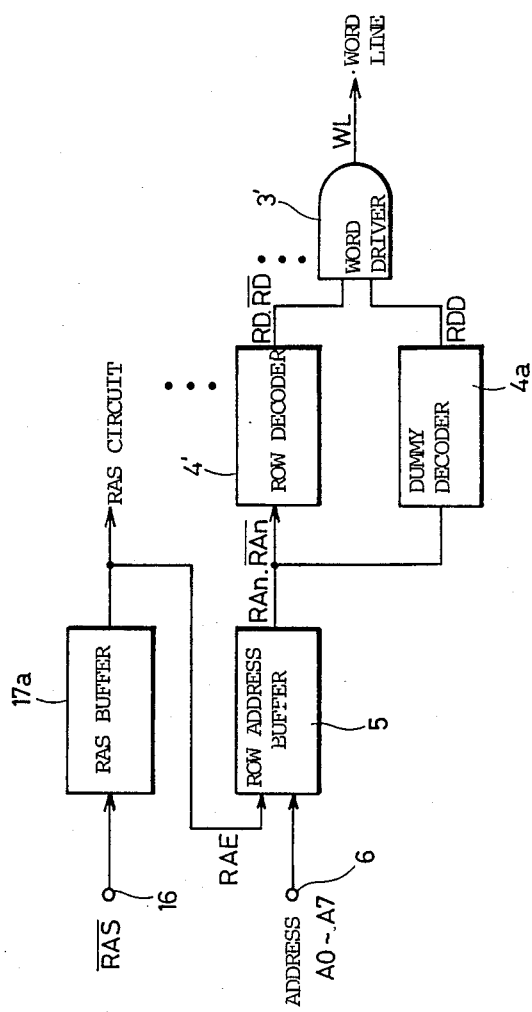
FIG. 3 is a block diagram showing the structure of a word line driving signal generation part in the conventional semiconductor memory device.
Figure 4:
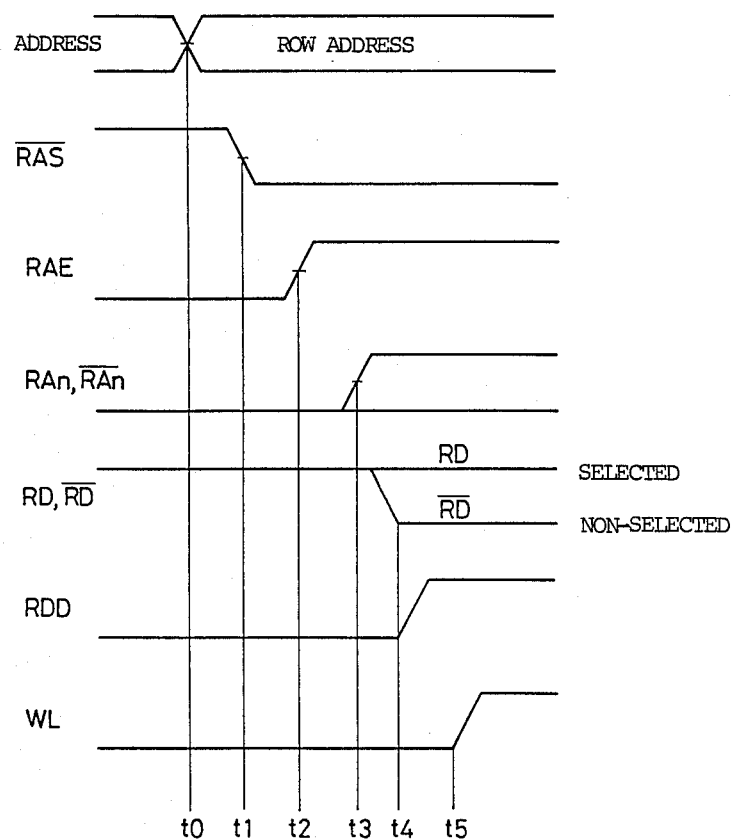
FIG. 4 is a waveform diagram for showing the operation of the word line driving signal generation part as shown in FIG. 3.
Figure 5:
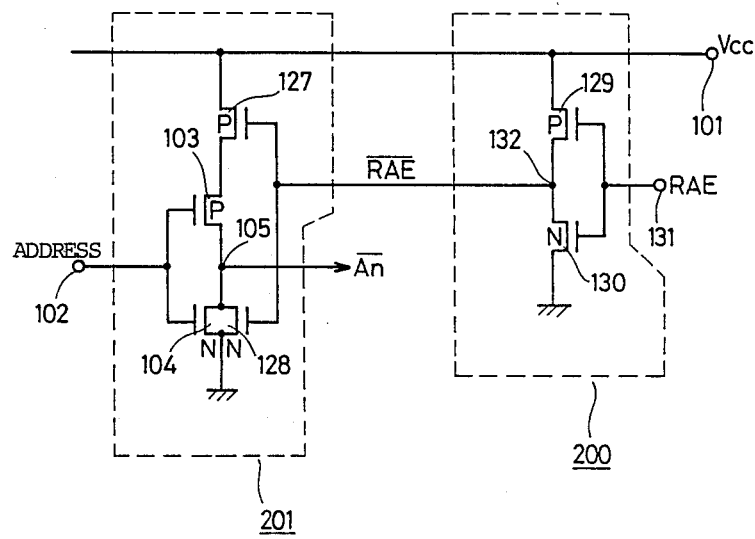
FIG. 5 specifically shows the structure of a conventional row address buffer.

As obvious from FIG. 7 compared with FIG. 4, the time between $t_0$ and $t_5$ required for accessing the memory cell in this embodiment is shorter than that in the conventional memory device. This is because the interval between $t_2$ and $t_3$ from generation of the signal RAE to generation of $\overline{RA_n}$ is removed in FIG. 7 and the signal RAE is generated in parallel in the row decoder selection interval between $t_3$ and $t_4$ that is, from the generation of $RA_n$ and $\overline{RA_n}$ generation of RD and $\overline{RD}$.

Figure 8:
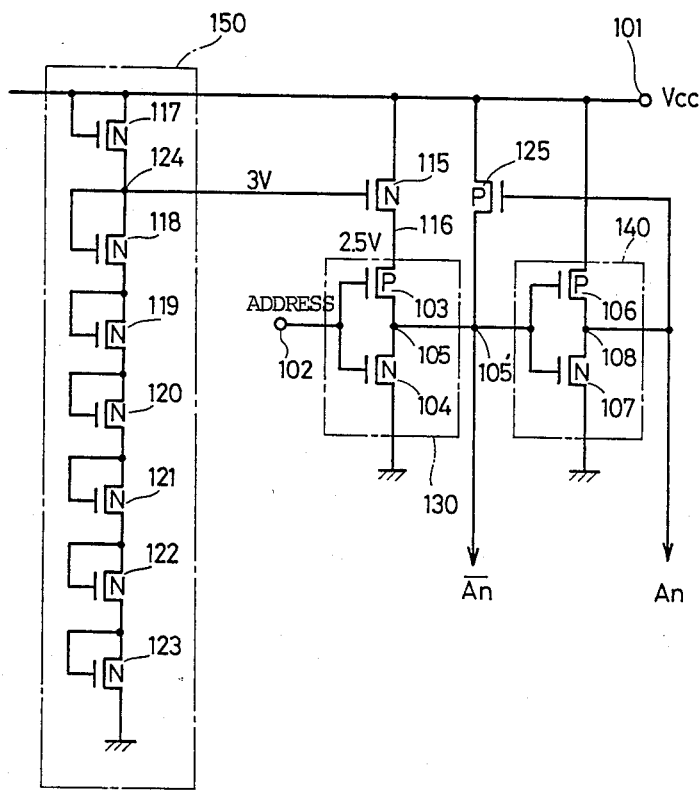
FIG. 8 shows exemplary structure of a row address buffer according to an embodiment of the present invention.

FIG. 8 shows exemplary structure of a row address buffer circuit according to an embodiment of the present invention.

Referring to FIG. 8, the row address buffer circuit comprises a constant voltage generation circuit 150 for receiving supply voltage $V_{CC}$ through the terminal 101 and producing an inner voltage of a prescribed voltage value, a first inverter 130 for receiving an external address signal $A_n$ (n=0 to 7) of the TTL level and outputting an inverted internal address signal $\overline{A_n}$ add a second inverter 140 for inverting the output from the first inverter 130 and outputting an internal address signal $A_n$.

The constant voltage generation circuit 150 comprises N-channel MOS transistors 117 to 123 which are connected in series between the supply voltage $V_{CC}$ and a ground potential.

The MOS transistor 117 has a gate and a first conduction terminal coupled to the supply voltage $V_{CC}$ and a second conduction terminal connected to an internal output terminal 124, to serve as a high-resistance load resistor. The plural (six in FIG. 8) MOS transistors 118 to 123 are connected in series between the output terminal 124 and the ground potential and each of them is diode-connected to reduce voltage by threshold voltage thereof.

The inverter 130 has a P-channel MOS transistor 103 and an N-channel MOS transistor 104 which are complementarily connected with each other. Both of the MOS transistors 103 and 104 receive the external address signal $A_n$ at their gates to output an inverted internal address signal $\overline{A_n}$ from a common node (terminal 105) thereof.

The inverter 140 has a P-channel MOS transistor 106 and an N-channel MOS transistor 107 which are complementarily connected with each other. The MOS transistors 106 and 107 receive output (internal address signal $\overline{A_n}$) from the inverter 130 at their gates, to output the internal row address signal $A_n$ at their common node (terminal 108).

Provided between the PMOS transistor 103 in the inverter 130 and the supply voltage $V_{CC}$ is an N-channel MOS transistor 115 which receives output from the constant voltage generation circuit 150 at its gate for reducing operating supply voltage for the inverter 130 to the TTL level.

Between the output terminal 105 of the inverter 130 and the supply voltage $V_{CC}$, a P-channel MOS transistor 125 is provided for receiving the output of the inverter 140 at its gate in order to pull up the inverted internal address signal $\overline{A_n}$ of "H" level to the FET level.

The operating supply voltage of the inverter 140 is the supply voltage $V_{CC}$ supplied to the terminal 101. Description is now made on the operation.

The supply voltage $V_{CC}$ is generally set at 5 V. When the supply voltage $V_{CC}$ is 5 V, threshold voltage of the NMOS transistors is generally set at 0.5 and threshold voltage of the PMOS transistors set at about $-0.5$ V. The high-resistance load MOS transistor 117 in the constant voltage generation circuit 150 is adapted to only supply voltage to the output terminal 124 without current flow, and is set at an extremely high resistance value of about 1 MΩ, for example. Since the load MOS transistor 117 is thus of high resistance so that substantially no current flows in the MOS transistor 117, the voltage value at the node 124 is decided by the sum of threshold voltage values of the MOS transistors 118 to 123. When six MOS transistors are connected in series as shown in FIG. 8, voltage $V_{124}$ at the node 124 is $0.5\times6=3.0$ V. This voltage of 3 V serves as constant voltage not affected by fluctuation in the supply voltage $V_{CC}$ since the voltage $V_{124}$ is decided by the threshold voltage values of the MOS transistors 118 to 123. The constant voltage of 3 V ($=V_{124}$) from the constant voltage generation circuit 150 is supplied to the gate of the NMOS transistor 115. The NMOS transistor 115 operates as the so-called source follower, whereby voltage of 2.5 V, which is lower than the gate voltage 3 V of the MOS transistor 115 by its threshold voltage of 0.5 V, is transmitted to a node 116. The voltage of 2.5 V at the node 116 serves as the operating supply voltage of the inverter 130. Even if an address signal of 2.4 V of the TTL level (address signal of high level) is applied to the terminal 102 in this state, voltage difference $V_{116}$–$V_{102}$ between the source electrode (node 116) of the MOS transistor 103 and the gate electrode (input terminal 102) is 2.5 V–2.4 V=0.1 V, which is smaller in absolute value than the threshold voltage ($-0.5$ V) of the MOS transistor 103. Therefore, the PMOS transistor 103 enters an OFF state and no current flows from the supply voltage $V_{CC}$ into the inverter 103. At this time, the NMOS transistor 104 enters an ON state and the potential of the node 105 goes low to the ground potential. Therefore, the inverter 140 outputs the internal address signal $A_n$ of the FET level, since the NMOS transistor 107 enters an OFF state and the PMOS transistor 106 enters an ON state to output a signal of $V_{CC}$ level.

When an address signal of low level is supplied to the input terminal 102, an inverted address signal at the level of 2.5 V is outputted to the node 105 (105'). In this case, the PMOS transistor 106 in the inverter 140 enters a conducting state, whereby a current flows from the supply voltage $V_{CC}$, into the inverter 140. In order to prevent this, the voltage at the node 108 (output of inverter 140) is fed back to the gate of the PMOS transistor 125 and the PMOS transistor 125 is turned on when the output of the inverter 140 is at a low level to increase the voltage at the node 105' to the level of the supply voltage $V_{CC}$, thereby to reliably make the PMOS transistor 106 enter an OFF state. As a result, an address signal of FET level is produced with reduced power consumption.

Implemented by the forementioned structure is a row address buffer of low power consumption which can be directly driven by an external row address signal of the TTL level.

Although the row address buffer is formed by MOS transistors in the aforementioned embodiment, an effect similar to the above can be attained also by employing IGFETs (insulated gate field effect transistors).

Although a positive power supply is employed in the above embodiment, the respective signals and FETs may be inverted in polarity so as to carry out the present invention with a negative power source.

Although MOS transistors are employed as constant voltage generation elements in the aforementioned embodiment, the same may be replaced by P-N junction diode to use forward voltage drops thereof.

Although the above embodiment has been described with reference to a 64 Kbit semiconductor memory device, the present invention is also applicable to a semiconductor memory device of other capacity.

According to the present invention as hereinabove described, the row address buffer circuit of the semiconductor memory device can be directly driven by the external address signal, whereby the access time starting from the address signal can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell array formed by a plurality of memory cells arrayed in the form of a matrix of rows and columns, said semiconductor memory device comprising:
   an input terminal for receiving a first control signal for activating said semiconductor memory device;
   an address input terminal for receiving an address signal corresponding to one of said plurality of memory cells;
   an address signal decoder for addressing an addressed one of said plurality of memory cells;
   address signal generation means responsive to said address signal and independent of said first control signal for generating an internal address signal;
   dummy decoder means responsive to said internal address and to said first control signal for applying to said address signal decoder an address signal for addressing said cells, said address signal generation means including
   (a) a first inverter circuit for receiving said external address signal;
   (b) a second inverter circuit for receiving an output from said first inverter circuit;
   (c) a first conductivity type first FET connected between a power source and the output of said first inverter circuit and having a gate connected to the output of said second inverter circuit;
   (d) a second conductivity type second FET in series between said first inverter circuit and said power source; and
   (e) a voltage generation circuit for applying a constant voltage smaller than the voltage of said power source to said gate of said second FET.

2. A semiconductor memory device in accordance with claim 1, further including:
   decoder means for decoding said internal address signal from said address signal generation means;
   first control means for generating a second control signal in response to said first control signal;
   said dummy decoder means including second control means being activated in response to said second control signal from said first control means for generating a third control signal entering an activated state in response to said internal address signal from said address signal generation means; and
   said address signal decoder including row select means enabled in response to said third control signal for activating a row addressed by said address signal in response to output from said decoder means.

3. A semiconductor memory device in accordance with claim 1, wherein dynamic storage elements are formed by FETs (Q) and capacitors (C).

4. A semiconductor memory device in accordance with claim 1, wherein each external address signal includes, in succession, a row address signal and a column address signal.

5. In a semiconductor memory device having a memory cell array formed by a plurality of row lines an a plurality of column lines intersecting said row lines, memory cells of said column lines, row and column address decoders responsive to an array, arranged at intersections of said row lines and said internal address signal for selecting row and column lines corresponding to a selected memory cell, a control input terminal for receiving a first control signal for accessing said memory device, an address input terminal for receiving an external address for addressing one of said memory cells via said row and column address decoders, an improvement wherein
   said memory device further includes row address buffer means for generating an internal row address for addressing a row of said plurality of memory cells responsive to said external address and independent of said first control signal;
   buffer means responsive to said first control signal for generating a second control signal; and
   dummy decoder means responsive to said internal row address and said second control signal for generating a third control signal;
   and wherein said row address decoder includes
   row select means responsive to said third control signal and said internal row address for activating a row addressed by said internal row address.

6. Improvement according to claim 5, wherein said dummy decoder means receives a predetermined set of internal address signals included in said internal row address, and said row select means receives remaining internal address signals of said internal row address.

7. In a semiconductor memory device having a memory cell array formed by a plurality of row lines and a plurality of column lines intersecting said row lines, memory cells of said column lines, row and column address decoders responsive to an array arranged at intersections of said row lines and said internal address signal for selecting row and column lines corresponding to a selected memory cell, a control input terminal for receiving a first control signal for accessing said memory device, an address input terminal for receiving an external address for addressing one of said memory cells via said row and column address decoders, a method of accessing cells from said array, comprising steps of:
   generating an internal row address for addressing a row of said plurality of memory cells in response to the external address but independent of the first control signal;
   generating a second control signal in response to the first control signal;
   generating a third control signal in response to the internal row address and the second control signal; and
   activating a row of said memory cells in response to the third control signal and the nternal row address.

* * * * *